United States Patent
Alba et al.

(10) Patent No.: US 7,288,427 B2
(45) Date of Patent: Oct. 30, 2007

(54) METHOD FOR REDUCING DEFECTS AFTER A METAL ETCHING IN SEMICONDUCTOR DEVICES

(75) Inventors: Simone Alba, Milan (IT); Alessandro Spandre, Pavia (IT); Barbara Zanderighi, Milan (IT)

(73) Assignee: STMicroelectronics S.r.l., Argate Brianza (IT)

( * ) Notice: Subject to any disclaimer, the term of this patent is extended or adjusted under 35 U.S.C. 154(b) by 282 days.

(21) Appl. No.: 11/009,687

(22) Filed: Dec. 10, 2004

(65) Prior Publication Data

US 2005/0186780 A1 Aug. 25, 2005

(30) Foreign Application Priority Data

Dec. 12, 2003 (IT) .......................... MI2003A2444

(51) Int. Cl.
*H01L 21/00* (2006.01)
(52) U.S. Cl. ........................... 438/69; 438/72; 438/636

(58) Field of Classification Search ................... 438/69, 438/72, 627, 628, 636, 643, 644
See application file for complete search history.

(56) References Cited

U.S. PATENT DOCUMENTS

| 6,093,973 | A  | * | 7/2000 | Ngo et al. ................... 257/797 |
| 6,345,399 | B1 | * | 2/2002 | Jamison et al. .............. 438/702 |
| 7,105,279 | B2 | * | 9/2006 | Vogt et al. ................... 430/313 |

* cited by examiner

*Primary Examiner*—Kevin M. Picardat
(74) *Attorney, Agent, or Firm*—Lisa K. Jorgenson; Allen, Dyer, Doppelt, Milbrath & Gilchrist, P.A.

(57) ABSTRACT

The method prevents oxidation or contamination phenomena of conductive interconnection structures in semiconductor devices and includes providing a layer of semiconductor or oxide base, a conductive layer or stack on the base layer, and an antireflection coating (ARC) layer on the conductive layer or stack. The method provides a thin dielectric covering layer on the antireflection coating layer to fill or cover the microfissures existing in the antireflection coating layer.

12 Claims, 2 Drawing Sheets

METHOD FOR REDUCING DEFECTS AFTER A METAL ETCHING IN SEMICONDUCTOR DEVICES

FIELD OF THE INVENTION

The present invention relates semiconductor processing, and more particularly, to a method for reducing defects after a metal etching in semiconductor devices.

BACKGROUND OF THE INVENTION

Various semiconductor devices include at least a layer of semiconductor or oxide base, a conductive layer or stack on the base layer, and an antireflection coating layer (ARC) on the conductive layer. For example, it is well known in the prior art that the aluminum oxide formed on the surface of aluminum and aluminum-alloy films, before an etching step, is particularly hard to etch with traditional metal etchers because these devices are designed to be oxide-selective.

Without limiting the scope of the invention and to simplify the explanation thereof, the following description is made with reference to the metal layers whereon photosensitive configurations are developed. Metal layers can comprise a metal stack having one or more metal or conductive metal layers (aluminum, aluminum alloys such as AlCu, AlSiCu and the like) connected by a thin upper ARC layer. As it is well known to the skilled in the semiconductor field, metal etching is used to form metal lines, particularly aluminum lines (more often aluminum alloys). These metal lines are used as interconnection structures between device structures formed in the silicon substrate.

The etching step of a metallization layer is a very important step in the semiconductor device manufacturing. In its simplest embodiment, the sequence of steps being concerned by the formation process of line or interconnection structure can be summarized as follows:

a metal layer is deposited first, the metal layer eventually comprising a metal stack having one or more conductive metal layers (aluminum, aluminum alloys such as AlCu, AlSiCu and the like);

to transfer etching configurations on metal layer or metal stack areas, a photoresist layer is applied on the metal layer and configurations are developed according to a mask layout;

according to the prior art, a traditional interconnection structure, such as an antireflection coating layer (ARC), such as TiN, TiW, etc., is often positioned on the metal layer or metal stack, before depositing the photoresist film. The ARC layer absorbs most of the radiation penetrating the photoresist during the photolithographic process when the photoresist is exposed to the radiation to reproduce mask configurations in the photoresist film.

By reducing the reflection in the underlying metal substrate and thus by reducing the standing-wave effects which can lead to a change in the desired configurations to be transferred, the photoresist layer is conveniently exposed. After the exposure, the photoresist layer is developed to realize the image, configurations or structures, which will serve as masks during the following etching process, when the designed configurations are transferred in the underlying metal layer.

Desire to increase the device density on many of the most advanced circuits are often limited by the area occupied by interconnection paths. The use of the metal layer anisotropic etching, together with an improved photoresist exposure and strict configuration definitions by inserting the antireflection coating layer (ARC), allows smaller fine metal pitches to be obtained (the pitch being the assembly of the size of a metal line and of the space between the lines, see for example the article by S. Wolf and R. N. Tauber, "Silicon Processing for the VLSI Era", Lattice Press, Vol. 1), and thus denser interconnection structures.

In the aluminum and aluminum-alloy dry etching step, one of the problems to be faced is the presence of particles or other surface imperfections which can stop or delay the etching process in the area being concerned, leaving some undesired unetched portions of the original metal layer. These unetched or remaining portions of the original metal film are residues which can short circuit adjacent metal structures. Process parameters affecting this phenomenon are for example the metal grain roughness and the photoresist type being used when preparing mask configurations before etching.

One of the causes of surface imperfections on metal films, particularly aluminum and aluminum-alloy films, is an oxidation process occurring on metal surfaces when they are exposed to humidity or to other oxidizing species during processings and/or the manufacturing steps usually following the metal film deposition. These processings and/or manufacturing steps can comprise, but they are not limited to: deposition of metal layers to form the metal stack; deposition of ARC layers; mask application with or without the following mask configuration and development; cleaning; etching, etc. In the case of aluminum and aluminum-alloy metal layers, humidity or other oxidizing species involve the formation of an aluminum oxide being very hard to etch ($Al_2O_3$).

The effect of a delay in the etching process (the so-called "starting period") of aluminum or aluminum-alloy films due to the presence of aluminum oxide on the surface is well known in the art and in literature, reference is still made to the article by S. Wolf and R. N. Tauber, "Silicon Processing for the VLSI Era", Lattice Press, Vol. 1, pp. 559-561. An aluminum or aluminum-alloy surface, not covered by aluminum oxide, spontaneously reacts with chloride and it is etched. Nevertheless, if the aluminum or aluminum-alloy surface is changed in some points or areas by the presence of aluminum oxide, these points or areas will not react with chloride.

Therefore they will not be etched and they will actually mask the underlying substrate which should be etched (micromasking effect). Therefore, the etching of aluminum or aluminum-alloy films, in the presence of aluminum oxide, requires the oxide to be removed before continuing with the underlying layer etching step and this removal can be completed by sputtering with reducing agent energetic ions. The sputtering step unfavorably affects the metal etching selectivity with respect to the masking layer material etching, in this case the photoresist mask, often leading to a loss in size and in the particular features of the original resist configurations.

Sometimes, to prevent size losses a thicker photoresist film should be used, although causing, among the other undesired effects: longer photoresist exposure and development time, thus reducing the process productive potentiality; and limitations of the ability to set smaller pitches, thus limiting the ability to increase the interconnection structure density. To prevent aluminum oxides from forming on aluminum or aluminum-alloy surfaces, much attention is drawn to avoiding exposing the metal layer to oxidizing agents (for example air humidity) after the metal deposition and before depositing the ARC layer.

Traditional methods and devices for the metal stack and ARC layer deposition provide that the metal stack and the ARC layer are deposited in succession completely under vacuum, thus drastically reducing the risk of exposing the aluminum or aluminum-alloy surface to the air preserving the vacuum integrity through the different metal stack and ARC layer deposition steps. Nevertheless, the use of the antireflection coating layer (ARC) potentially inserts another risk of contamination of the metal surface. In fact the appearance of microfissures in the antireflection coating layer (ARC) can still allow oxidizing species to infiltrate in the underlying metal layer. The oxidizing species can derive from the mask development and let in this specific case the exposed AlCu layer portions oxidize.

FIGS. 1A-1C show, by way of example, the harmful effect of oxidizing species infiltration, for example a mask developer or BARC solvents, and the following defects in a specific case. FIG. 1A shows, for example, a simplified stack for a traditional interconnection structure. A metal layer 2, for example an aluminum or aluminum-alloy film, is deposited on a semiconductor substrate 1, for example an oxide layer. An antireflection coating (ARC) film 3, for example a TiN layer, is applied on the metal layer 2. The ARC film has microfissures 9 which, as shown in FIG. 1B, can allow oxidizing species to infiltrate in the underlying aluminum or aluminum-alloy layer in some areas 7.

Oxidation occurs during the BARC (4) spinning, during the mask exposure and/or during the mask development when the photoresist 5 configuration is defined, and the oxidized aluminum ($Al_2O_3$) has been formed. Since the oxidized aluminum is very hard to etch, it generates a defect better known as micromasking, leaving a metal bridge between adjacent strips, generating the metal line short circuit, as shown in FIG. 1C.

These kind of microfissures 9, in the ARC layer 3, which can exist also in the photoresist film, are known in the prior art and they are mentioned for example in the article by E. G. Colgan and al., "Formation Mechanism of Ring Defects during Metal RIE" (1994 VMIC conference Proceedings, 7-8 Jun. 1994, p. 284-286) as well as in the U.S. Pat. No. 6,345,399 and in the U.S. Pat. No. 6,153,504.

In the U.S. Pat. No. 6,345,399 fissures are generated in the photoresist by internal stresses and they can spread in the underlying substrate. In the U.S. Pat. No. 6,153,504 fissures are mentioned when depositing a traditional TiN ARC. In the specific case of preferred embodiments of this application, when the metal layer is an AlCu film and the antireflection coating layer (ARC) is made of TiN, microfissures appear as a consequence of the AlCu roughness during the TiN deposition.

The U.S. Pat. No. 6,345,399 addresses the problem of microfissures in the photoresist film by positioning a hard mask between the photoresist layer and the layer of material to be etched. In particular, the method being described in that patent attempts to prevent microfissures from propagating from the photoresist to an underlying material layer during the lithography and etching. In this case a compressed hard mask is used since fissures cannot propagate between two layers having different tension properties.

If the approach provided by the U.S. Pat. No. 6,345,399 were transferred to the case of the ARC layer failure contrast, an additional layer should be positioned between the AlCu and TiN layers. This cannot be easily performed since TiN is positioned just after the AlCu deposition in the same device without being exposed to the air, which could oxidize the AlCu layer. Alternatively, the AlCu layer should be covered by a more convenient or conformal layer. In both approaches the substrate reflecting properties could drastically change, deeply affecting the following lithographic configuration.

In the U.S. Pat. No. 6,153,504 the problem of microfissures in the TiN ARC layer is faced by replacing the traditional TiN ARC layer deposited on the metal film with a silicon oxynitride layer (SiON) serving both as ARC layer and as hard mask. The hard mask approach is fully used when manufacturing microelectronic devices and it is used where the photoresist thickness is not sufficient to support the whole etching process with the photoresist-substrate etching selectivity being used.

The photoresist becomes thinner when the configuration size is reduced. Since substrates must keep the thickness thereof for reliability reasons, to address the thinner photoresist two approaches can be undertaken:

(1) improving the photoresist-substrate selectivity; and
(2) positioning an additional layer being selective to the chemistry to be used to etch the substrate, i.e. the hard mask.

Since beyond a certain level it is difficult to improve the selectivity, the insertion of a hard mask layer can be the key. Such a hard mask layer, positioned between the substrate and the photoresist, serves as an additional photoresist layer. The thickness and the nature thereof depend on process requirements and selectivity, but it is generally higher than 1000 Å. The hard mask layer is actually a manufacture favoring the definition of more and more severe structures by using the same etching processes or at least by allowing lower process changes. The insertion of a SiON hard mask in the metal etching, as described in the U.S. Pat. No. 6,153,504, has the additional advantage of reducing the surface change caused by the developer penetration through the ARC during the metal masking, as the SiON ARC/hard mask is resistant to chemical penetration. Nevertheless, the insertion of a SiON ARC/hard mask inserts some complexities in the metal layer deposition process and in the coating process thereof with a dielectric ARC layer, rather than conductive, and in the etching process of the ARC layer and of the hard mask layer with a different chemistry from the one being used afterwards to etch the metal layer or metal stack.

Moreover for the application being described in the U.S. Pat. No. 6,153,504 the use of a SiON ARC layer and of a hard mask layer does not solve the difficulty of carefully configuring both the photoresist material and the underlying ARC layer yet to obtain vertical profiles. In particular, as described in the U.S. Pat. No. 6,153,504 and further in detail in the U.S. Pat. No. 6,093,973, there are strong interactions between the chemistries of the ARC layer and of a photoresist layer, when the ARC materials comprise basic components such as the nitrogen and the resist is a traditional deep ultraviolet resist (DUV). These interactions lead to the formation of residues on the photoresist/ARC interface, near the photoresist side wall, better known as "base": the photoresist base often involves a size control lack.

The correction of the base problem identified by the U.S. Pat. No. 6,153,504 and by the U.S. Pat. No. 6,093,973 involves the deposition on the ARC comprising nitrogen of a conveniently-thick oxide film to effectively cover the ARC comprising nitrogen. Nevertheless, the traditional hard mask or "thickness" approach, as the one described in the U.S. Pat. No. 6,153,504 and in the U.S. Pat. No. 6,093,973, has some drawbacks. In fact is it usually necessary to etch the hard mask in a dedicated device (for example oxide etching), since metal etchers are designed to be selective to the oxide.

Alternatively, if metal etcher performances are "prolonged" to allow the hard mask to be etched with the oxide, the dangerous mixture between etching chemistries and oxide and metal by-products can degrade the metal etcher defect and process stability. Moreover, the oxide film of the U.S. Pat. No. 6,153,504 and of the U.S. Pat. No. 6,093,973 should not comprise nitrogen or other components which, acting as bases, can interact with the photoresist negatively affecting the configuration process of the photoresist.

From the previous prior art attempts, there has not been a solution to the technical problem of microfissures in the ARC layer and to the subsequent surface alteration danger when pollutants penetrate through the microfissures into the underlying layers. Moreover, no approach has been provided that is: compatible with the traditional metal stack and ARC layer deposition; without specific requirements or limitations about the material to be used; and with a negligible influence on the metal etching and on the following steps (i.e. dielectric filling and way etching).

Therefore, in the semiconductor manufacturing field, a strong need is felt to provide a manufacturing method of a semiconductor device preventing the infiltrations through the microfissures in an underlying layer, the infiltration being capable to change the underlying layer.

SUMMARY OF THE INVENTION

In particular, an object of the present invention is to provide a method to prevent a change of an underlying conductive film, for example a metal layer, because of an infiltration of reacting species through fissures or microfissures of an above layer, for example an ARC layer.

Another object of the present invention is to protect an underlying aluminum or aluminum-alloy surface from the local oxidation during any following operation or process step such as the BARC spinning, the exposure and the resist mask development, because of the penetration of oxidizing species, such as the mask developer, through the microfissures or fissures on the ARC layer, the ARC being formed for example a TiN layer.

The present invention provides a method to remedy prior art incompatibilities and limitations by inserting a physical barrier between the ARC layer and the masking layer, and wherein the barrier is a thin covering layer having a negligible thickness, with the goal to fill or "plug" the ARC layer microfissures, in order to prevent infiltrations. The covering layer can be advantageously an oxide, but it can virtually be any other suitable material.

According to the present invention, the technical problem is solved by a method for preventing oxidation or contamination phenomena of conductive interconnection structures in semiconductor devices comprising at least: a layer of semiconductor or oxide base; a conductive layer or stack on the layer of semiconductor or oxide base; an antireflection coating layer (ARC) on the conductive layer or stack, and a thin dielectric covering layer provided on the antireflection coating layer.

The features and advantages of the method according to the invention will be apparent from the following description of an embodiment thereof given by way of non-limiting example with reference to the attached drawings.

DETAILED DESCRIPTION OF THE PREFERRED EMBODIMENTS

Figure 2A:
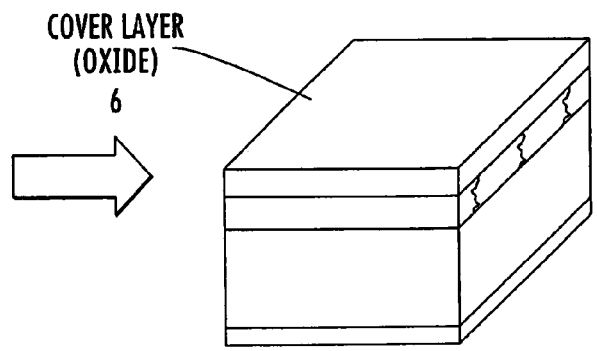
FIG. 2A is a schematic perspective view showing a semiconductor structure obtained according to the invention for the metal interconnection before the masking and configuration and wherein a metal layer is positioned on an oxide substrate and it is covered by an ARC layer comprising microfissures; in this case the stack is covered by a thin protective layer (oxide) according to the invention.
Figure 2B:
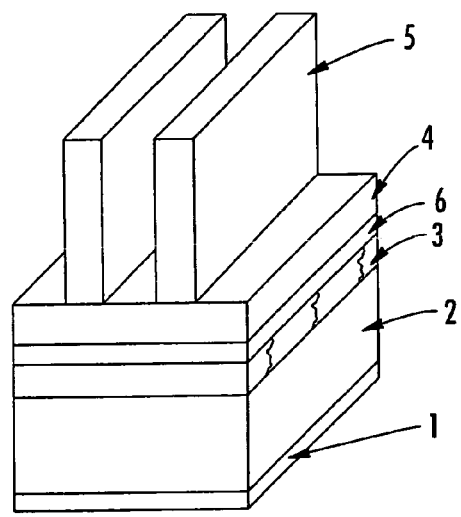
FIG. 2B is a schematic perspective view showing the same structure according to the invention as FIG. 2A, after a BARC deposition and a photoresist configuration.
Figure 2C:
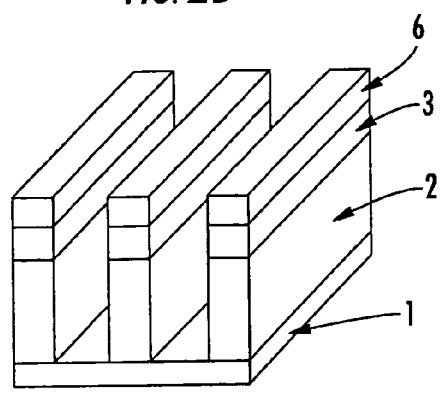
FIG. 2C is a schematic perspective view showing the structure according to the invention of FIG. 2B after a metal etching, and wherein the BARC and photoresist mask has been removed.

With reference to the views of the figures, particularly to the examples of FIGS. 2A-2C, a semiconductor material substrate, for example an oxide layer, undergoing following processing steps according to the method of the present invention, is generally schematically indicated with 1. The process steps and structures described hereafter do not form a complete process flow for producing integrated circuits. In fact the present invention can be implemented together with the integrated circuit manufacturing techniques presently used in this field, and only those common process steps being necessary to understand the invention will be described hereafter. Figures showing cross sections through a semiconductor wafer are not drawn to scale, but rather to emphasize the main features of the invention.

Figure 1A:
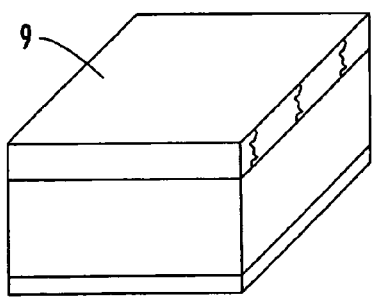
FIG. 1A is a schematic perspective view showing a conventional metal interconnection structure before the masking and configuration and wherein a metal layer is positioned on an oxide substrate and it is covered by an ARC layer comprising microfissures.

The preferred embodiment of the present invention will be illustrated first, followed by a discussion about the advantages of the invention. FIG. 1A shows the stack of a traditional interconnection substrate as deposited. The simplified structure comprises a base semiconductor substrate or an oxide layer 1, for example an oxide substrate, whereon a metal stack 2 is deposited, for example an aluminum or aluminum-alloy film (AlSi, AlCu, AlSiCu and the like).

An antireflection coating (ARC) layer 3, for example TiN, Ti, TiW, etc., is applied on the metal stack 2. In the present description the metal layer of the structure of the invention will be also alternatively indicated as aluminum alloy, AlCu, used in this specific case only with the aim of simplifying the description thereof and without limiting the scope of the invention. By similar reasoning, the antireflection coating (ARC) layer 3 can be also indicated with the name of the composing material, which is the titanium nitride (TiN) for the specific case used as example to show the invention.

Figure 1B:
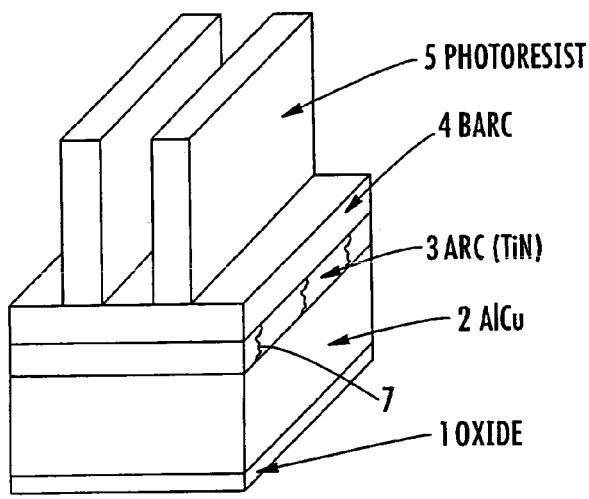
FIG. 1B is a schematic perspective view showing the same structure as FIG. 1A, after a BARC deposition and a photoresist configuration.

With reference to FIG. 1B, a photoresist layer 5 is disposed on the metal layer 2. Advantageously, an additional BARC layer 4 can be positioned between the ARC layer 3 and a resist layer 5. As it is known in the art, the exposure radiation is selectively applied to a mask or grid to selectively expose and insulate different regions of the photoresist layer 5 to develop a photoresist configuration. This photoresist configuration is then transferred afterwards on the metal layer 2 through etching process steps.

Figure 1C:
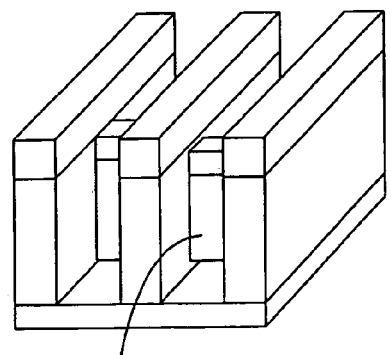
FIG. 1C is a schematic perspective view showing the structure of FIG. 1B after the metal etching, wherein defects or "bridges" or residues can be seen between metal lines.

FIG. 1C shows the post-etching results after a traditional process flow. The fissures 9 in the antireflection coating (the TiN covering layer, as example in FIGS. 1A and 2A) rise from the roughness during the AlCu deposition. These fissures 9 can be the paths wherethrough the oxidizing species can penetrate the AlCu layer, as indicated in FIG. 1B by the areas 7. It is believed that this phenomenon occurs during the exposure and mask development, but the problem can also rise during the BARC spinning or during the mask development. Since the resulting $Al_2O_3$ is extremely hard to etch, it behaves like a mask, hiding the underlying AlCu (FIGS. 1B and 1C) and creating an AlCu "bridge" 8 connecting adjacent strips, as shown in FIG. 1C.

FIGS. 2A-2C schematically show the idea according to the invention to insert, in the same process flow, a thin dielectric covering layer 6 to be positioned on the ARC layer 3 to fill or plug the fissures 9 or clefts of the ARC layer. The thin protective layer 6 is deposited after depositing the ARC layer and before applying the photoresist configurations and the protective layer can comprise a thin dielectric layer, for example a thin oxide film.

Therefore the invention provides a method for depositing a thin dielectric covering layer 6 to fill or cover the microfissures 9 in an antireflection coating layer (ARC) 3. The purpose of the thin dielectric covering layer 6 is to prevent the underlying conductive layer from contacting any species with which it could react to form stable compounds, such as oxides and for example aluminum oxides ($Al_2O_3$).

In fact the present invention derives from the discovery that, when a thin dielectric covering layer 6, corresponding to 200 Å or less of silicon oxide, is disposed on the metal stack 2, the fissures 9 in the ARC layer 3 are plugged. The oxidation, shown in the traditional profess flow with the changed areas 7 in FIG. 1B, cannot occur in the semiconductor structure realized with the method of the invention and represented in FIG. 2B.

Therefore the etching continues up to the trench bottom removing the substrate along the configured structures (FIG. 2C). Advantageously, in the implementation of the method of the invention, due to the reduced thickness of the dielectric covering layer 6 which can be used, a dedicated removal step of the thicker dielectric layer from the configured area according to the prior art, also called hard mask, is not necessary before continuing with the traditional metal etching configuration process. In fact the need for a dedicated hard mask opening step could insert further complications as previously described.

Figure 3:
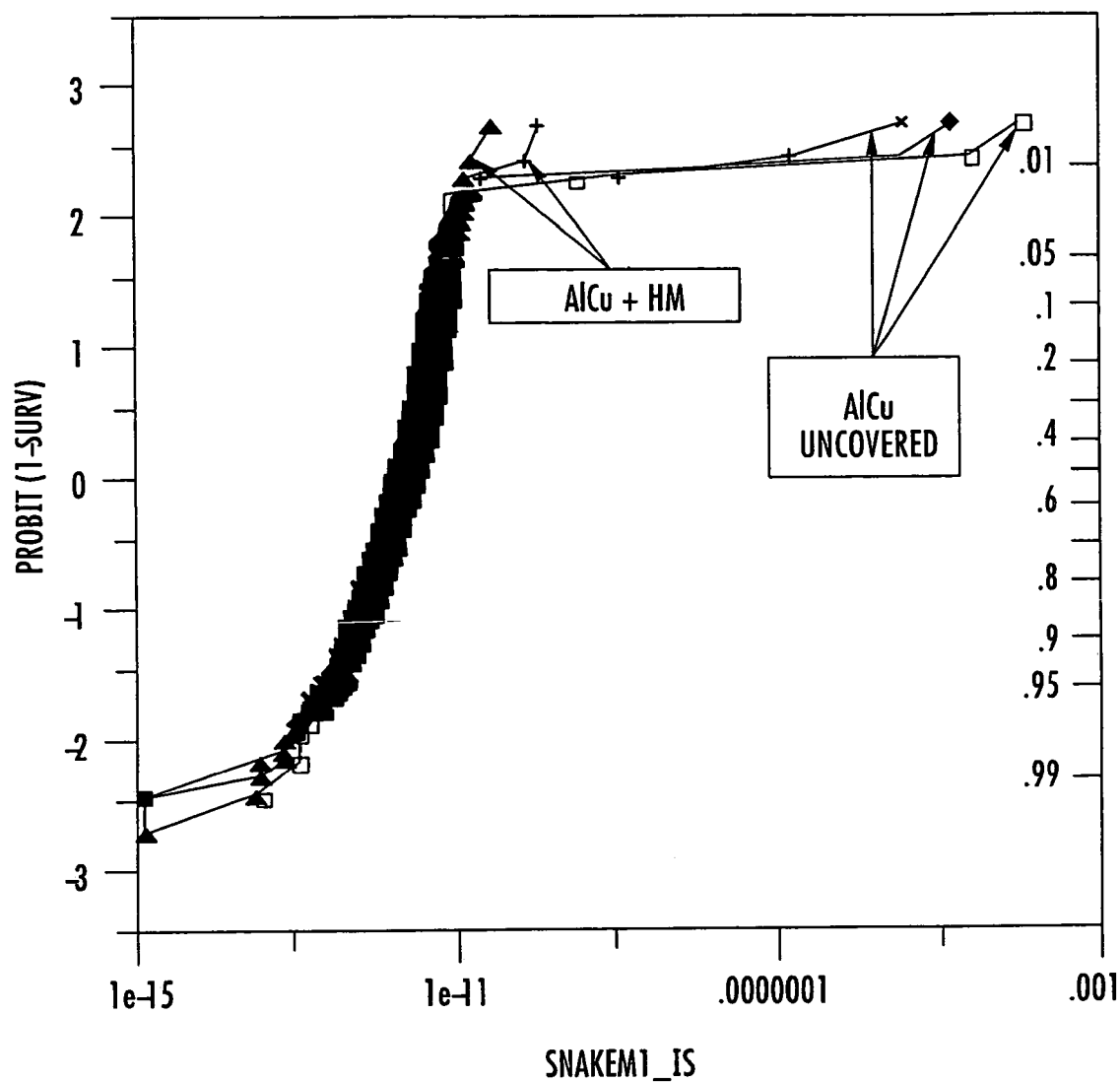
FIG. 3 is a diagram illustrating the electric performances of the series of fissures realized with the traditional process flow and with the method of the invention.

To show the advantages of the use of a thin covering layer, tests have been carried out by etching a series of fissures in traditional wafers and in wafers being covered by the thin covering layer. FIG. 3 shows through a diagram the electric performances of the series: the Y axis show the percentage of electric failures, while the X axis shows the electric current flowing between two adjacent metal strips (without shortcuts the current is very low). As it can be noted, those fissures wherein the thin covering layer has been implemented do not show shorts, while a queue exists in the distributions corresponding to the traditional case (uncovered AlCu).

That which is claimed is:

1. A method for making a semiconductor device comprising:
   providing a semiconductor base layer;
   forming at least one conductive layer on the semiconductor base layer;
   forming an antireflection coating (ARC) layer on the at least one conductive layer, the ARC layer including microfissures therein; and
   forming a relatively thin dielectric covering layer on the ARC layer to fill and cover the microfissures in the ARC layer.

2. A method according to claim 1, wherein the thickness of the dielectric covering layer is less than 200 Å.

3. A method according to claim 1, wherein said dielectric covering layer comprises silicon oxide.

4. A method according to claim 1, wherein said at least one conductive layer comprises a metal layer.

5. A method according to claim 4, wherein said metal layer comprises at least one of an aluminium and aluminiumalloy layer.

6. A method according to claim 1, further comprising forming an auxiliary ARC layer on said ARC layer before depositing said dielectric covering layer.

7. A method for making a semiconductor device comprising:
   forming at least one conductive layer on a semiconductor base layer;
   forming an antireflection coating (ARC) layer on the at least one conductive layer, the ARC layer having microfissures; and
   forming a dielectric covering layer on the ARC layer to fill and cover the microfissures in the ARC layer.

8. A method according to claim 7, wherein the thickness of the dielectric covering layer is less than 200 Å.

9. A method according to claim 7, wherein said dielectric covering layer comprises silicon oxide.

10. A method according to claim 7, wherein said at least one conductive layer comprises a metal layer.

11. A method according to claim 7, wherein said metal layer comprises at least one of an aluminium and aluminiumalloy layer.

12. A method according to claim 7, further comprising forming an auxiliary antireflection coating layer on said ARC layer before depositing said dielectric covering layer.

* * * * *

UNITED STATES PATENT AND TRADEMARK OFFICE
CERTIFICATE OF CORRECTION

PATENT NO. : 7,288,427 B2  
APPLICATION NO. : 11/009687  
DATED : October 30, 2007  
INVENTOR(S) : Alba et al.

Page 1 of 1

It is certified that error appears in the above-identified patent and that said Letters Patent is hereby corrected as shown below:

| | |
|---|---|
| Cover page (73) Assignee | Delete: "Argate"<br>Insert: -- Agrate -- |
| Column 4, Line 65 | Delete: "is it"<br>Insert: -- it is -- |
| Column 8, Lines 27-28 | Delete: "aluminium and aluminiumalloy"<br>Insert: -- aluminum and aluminum alloy -- |
| Column 8, Line 48 | Delete: "7"<br>Insert: -- 10 -- |
| Column 8, Lines 49-50 | Delete: "aluminium and aluminiumalloy"<br>Insert: -- aluminum and aluminum alloy -- |

Signed and Sealed this

Twenty-ninth Day of July, 2008

JON W. DUDAS  
*Director of the United States Patent and Trademark Office*